United States Patent
Huang

[11] Patent Number: 5,981,385
[45] Date of Patent: Nov. 9, 1999

[54] DIMPLE ELIMINATION IN A TUNGSTEN ETCH BACK PROCESS BY REVERSE IMAGE PATTERNING

[75] Inventor: Yuan-Chang Huang, Hsin-Chu, Taiwan

[73] Assignee: Taiwan Semiconductor Manufacturing Company Ltd., Hsin-Chu, Taiwan

[21] Appl. No.: 08/789,725

[22] Filed: Jan. 27, 1997

[51] Int. Cl.$^6$ .................................................. H01L 21/283
[52] U.S. Cl. ........................ 438/672; 438/637; 438/648; 438/675
[58] Field of Search ..................... 438/675, 685, 438/634, 644, 637, 648, 669, 672, FOR 170, FOR 196

[56] References Cited

U.S. PATENT DOCUMENTS

| | | | |
|---|---|---|---|
| 4,520,041 | 5/1985 | Aoyama et al. | 438/472 |
| 5,221,640 | 6/1993 | Sato | 438/685 |
| 5,231,051 | 7/1993 | Baldi et al. | 438/685 |
| 5,244,534 | 9/1993 | Yu et al. | 438/672 |
| 5,284,799 | 2/1994 | Sato | 438/618 |
| 5,286,675 | 2/1994 | Chen et al. | 438/624 |
| 5,374,591 | 12/1994 | Hasegawa et al. | 438/628 |
| 5,459,345 | 10/1995 | Okudaira et al. | 357/310 |
| 5,506,168 | 4/1996 | Morita et al. | 437/67 |
| 5,527,736 | 6/1996 | Huang et al. | 437/195 |
| 5,668,064 | 9/1997 | Park et al. | 438/685 |

OTHER PUBLICATIONS

S. Wolf et al. "Silicon Processing for the VLSI Era" vol. 1—Process Technology, pp. 418–423, 1986.

*Primary Examiner*—Carl Whitehead, Jr
*Assistant Examiner*—Marcia Guerrero
*Attorney, Agent, or Firm*—George O. Saile; Stephen B. Ackerman; William J. Stoffel

[57] ABSTRACT

A new method of metallization using a dimple free tungsten plug is described. An insulating layer is deposited overlying semiconductor device structures. An opening is etched through the insulating layer to contact one of the semiconductor device structures. A layer of tungsten is deposited overlying the insulating layer and within the opening. A photoresist block is formed on the tungsten layer over the contact opening. The photoresist block is a reverse pattern of the photoresist layer used to define the opening in the insulating layer. The tungsten layer is partially etched forming a mound in the tungsten layer under the photoresist block and over the opening. The photoresist block is removed and the remaining tungsten layer is etched again resulting in the formation of a dimple free tungsten plug with a planar surface.

14 Claims, 3 Drawing Sheets

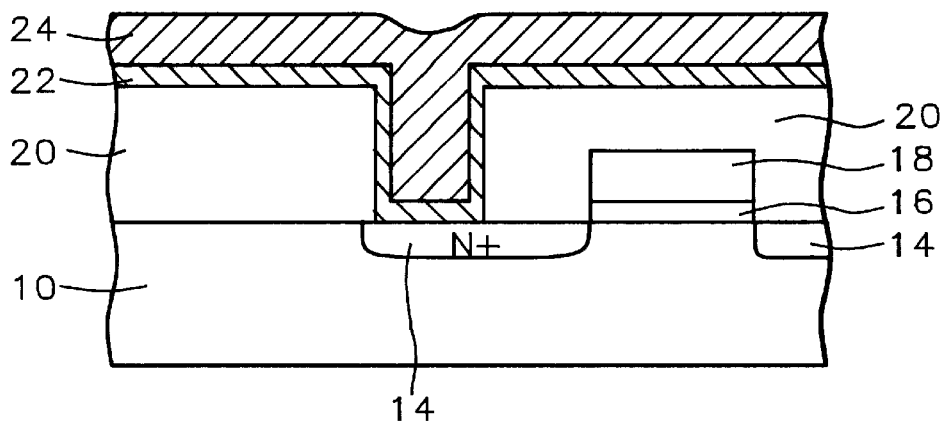
FIG. 1 – Prior Art
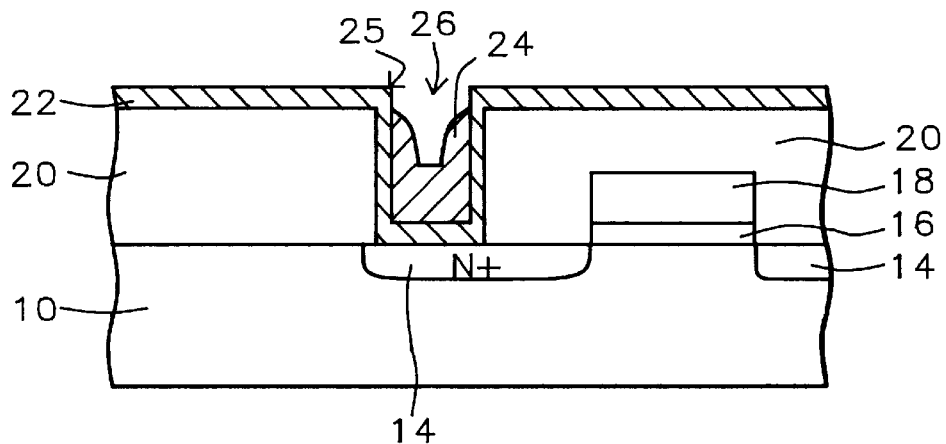
FIG. 2 – Prior Art
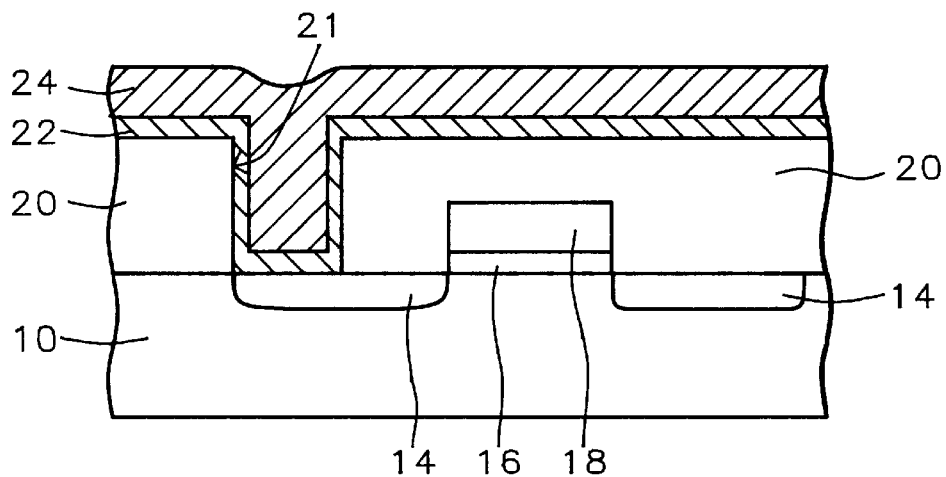
FIG. 3

DIMPLE ELIMINATION IN A TUNGSTEN ETCH BACK PROCESS BY REVERSE IMAGE PATTERNING

BACKGROUND OF INVENTION (1) Field of the Invention

The invention relates to a method of metallization in the fabrication of integrated circuits, and more particularly, to a method of tungsten metallization which avoids dimple formation during tungsten etch back resulting in improved step coverage in the manufacture of integrated circuits.

(2) Description of the Prior Art

The conventional tungsten etching back process has an inevitable dimple formation at the center of the tungsten plug hole. The dimple feature will result in bad metal step coverage across the tungsten plug during metal deposition after tungsten etching back. This problem will become progressively worse at higher levels of metallization if the stacked via scheme is implemented.

Referring now to FIG. 1, there is illustrated a conventional tungsten plug process of the prior art. There is shown semiconductor substrate 10 in which have been formed source/drain regions 14. Gate electrode 18 has been formed overlying the gate silicon oxide layer 16. A contact hole has been opened through the insulating layer 20 to the source and drain region 14. The glue layer 22 has been deposited over the surface of the substrate and within the contact hole. A layer of tungsten 24 has been deposited over the surface of the glue layer within the contact hole.

Referring now to FIG. 2, the tungsten is etched back using conventional $SF_6/N_2$ plasmas, resulting in recess 25 and dimple 26. This dimple formation will degrade the metal deposition conformity across the tungsten plug. A metal void may occur at metal level 3 or 4 if stacked via and tungsten plug methods are implemented. The dimple may also increase the difficulty of intermetal dielectric planarization.

Workers in the art have tried to avoid the tungsten plug dimple problem by using thick chemical vapor deposited (CVD) tungsten on the order of 8000 Angstroms for to improve tungsten deposition conformity and to alleviate the dimple problem in etching back. However, the dimple problem still occurs because over etching is inevitable.

Others have striven to solve some of these problems. For example, U.S. Pat. No. 5,506,168 (Morita et al) shows various methods of creating a raised portion of a plug. U.S. Pat. No. 5,527,736 (Huang et al) shows a method of forming a dimple free plug process. However, these methods can be further improved.

SUMMARY OF THE INVENTION

A principal object of the present invention is to provide an effective and very manufacturable method of dimple-free (void free) tungsten plug metallization.

Another object of the present invention is to form a tungsten layer with a mound over a tungsten plug so that when the tungsten is etched back, the resulting surface of the tungsten plug is level (planar).

Another object of the present invention is to planarize the surface across the tungsten plug.

In accordance with the object of this invention a new method of metallization using a dimple-free tungsten plug is achieved. Semiconductor device structures are formed in and on a semiconductor substrate. An insulating layer is deposited overlying the semiconductor device structures. An opening is etched through the insulating layer to contact one of the semiconductor device structures. A glue (adhesion) layer is conformally formed on the insulating layer. A layer of tungsten is deposited overlying the glue layer and within the opening. A photoresist block is formed on the tungsten layer 24 over the opening. This photoresist block is used as a mask to isotropically etch a portion of the tungsten layer leaving a mound in the tungsten layer under the photoresist block and over the opening. The photoresist block is removed and the tungsten layer 24A is etched again forming a tungsten plug with a planar surface inside of the opening.

The invention prevents the formation of a dimple within the tungsten plug completing the formation of the dimple-free tungsten plug in the fabrication of an integrated circuit.

BRIEF DESCRIPTION OF THE DRAWINGS

In the accompanying drawings forming a material part of this description, there is shown:

FIGS. 1 and 2 schematically illustrate in cross-sectional representation a conventional tungsten plug process of the prior art.

FIGS. 3 through 7 schematically illustrate in cross-sectional representation a preferred embodiment of the present invention.

DESCRIPTION OF THE PREFERRED EMBODIMENTS

Figure 4:
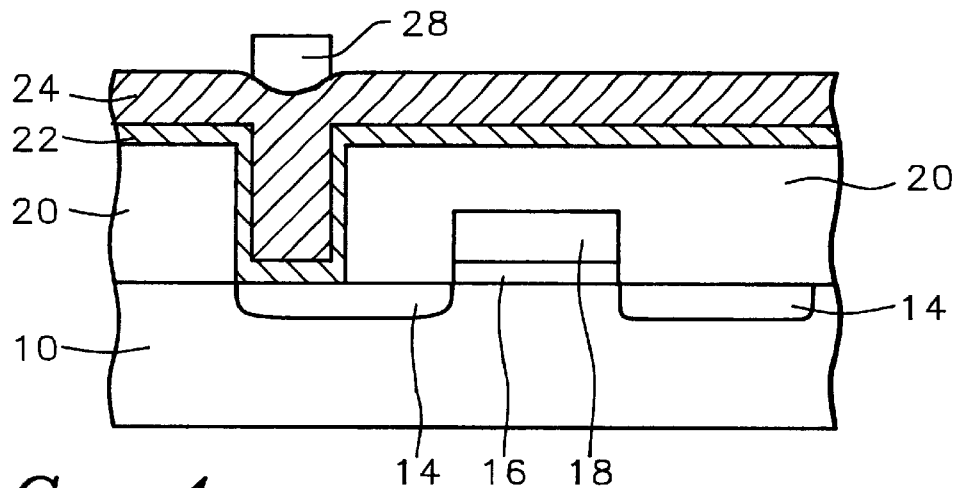

Referring now more particularly to FIG. 3, there is illustrated a portion of a partially completed integrated circuit. There is shown a semiconductor substrate 10, preferably composed of monocrystalline silicon. Source/drain regions 14 are formed as is understood in the art either before or after formation of the gate electrode 18 overlying gate silicon oxide layer 16.

An insulating layer 20, composed of borophosphosilicate glass (BPSG), borosilicate glass (BSG), or phosphosilicate glass (PSG), or the like is deposited over the surface of the semiconductor structures to a thickness of between about 5000 to 9000 Angstroms.

A contact hole 21 is opened through the insulating layer 20 to the source/drain region 14 within the semiconductor substrate and has a diameter of between about 0.35 and 0.8 $\mu$m. The contact hole 21 is formed using a conventional photolithography process using a contact or via (image) mask (e.g., optical mask).

An optional glue (or adhesion) layer 22 is deposited conformally over the surface of the insulation layer 20 and within the contact hole. The glue layer is preferably composed of collimated titanium, titanium, or titanium nitride and is more preferably composed of titanium nitride. The glue layer 22 is preferably deposited by plasma sputtering to a thickness of between about 400 and 1200 Angstroms.

A metal layer 24 is deposited over the glue layer 22 to fill the contact hole. The metal layer 24 preferably has a thickness of between about 5000 and 8000 Angstroms. The metal layer 24 is preferably composed of tungsten, and other suitable metals or alloys can be used. Hereinafter the metal layer 24 is referred to as the tungsten layer 24, but the metal layer is not limited to the tungsten material. Simllarly the metal plug 32 described below can be formed of other metals or alloys, but is referred to as a tungsten plug 32.

The novel process of the present invention will now be described. Referring now to FIG. 4, a photoresist block 28 is formed over a portion of the tungsten layer 24 covering the opening of the contact hole. The photoresist block 28 is formed by a reverse image pattern process.

This reverse image pattern can be formed by either of two methods. In the first method, a positive photoresist layer is coated over the tungsten layer 24 and the positive photoresist layer is exposed with a reverse image mask (contact or via). In the second method, a negative photoresist layer is coated over the tungsten layer and is exposed with the image mask (used to define the hole opening 21). The first method is preferably used to form the photoresist block.

The photoresist block 28 preferably has a diameter of between about 0.35 and 0.8 μm. The diameter of the photoresist block 28 is preferably between about 67 and 100% of the diameter of the opening 21. The photoresist block preferably has a thickness of between about 5000 and 10000 Angstroms and more preferably 7500 Angstroms.

Figure 5:
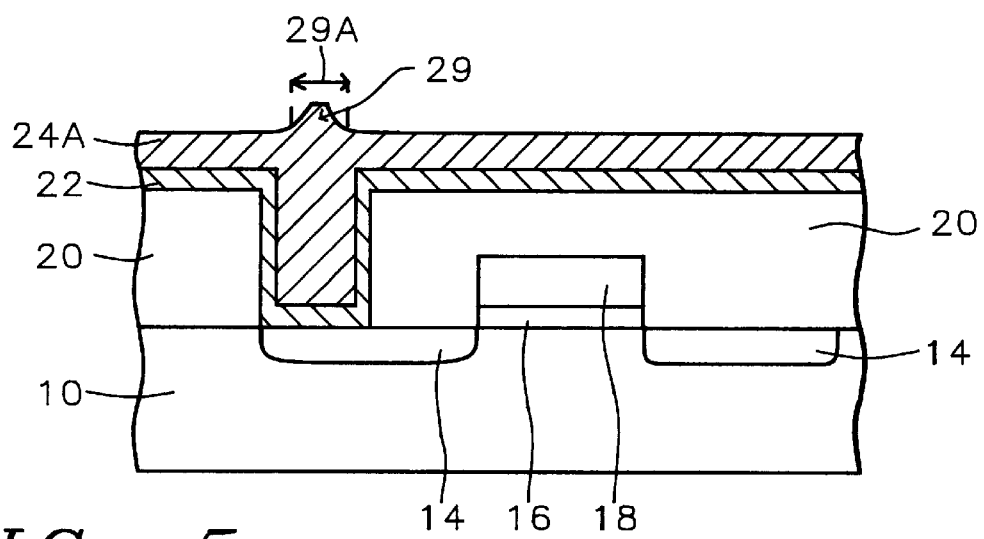

Referring to FIG. 5, the tungsten layer 24 is partially etched using the photoresist block 28 as a mask, forming a mound 29 (i.e. protuberant surface) of the tungsten layer 24A under the photoresist block 28, which is over the opening of the contact hole. The tungsten layer 24 is preferably isotropically etched. The tungsten layer 24 is preferably etched using a fluorine containing plasma at a flow rate of between about 300 and 500 sccm, and more preferably 400 sccm, at a pressure of between about 200 and 400 mTorr, and more preferably 300 mTorr, at a temperature of between about 0 and 80° C., and more preferably 40° C., for a duration of between about 30 and 60 seconds, and more preferably about 45 seconds, corresponding to the tungsten loss of between about 2000 and 3000 Angstroms, and an electrode spacing of between about 2.0 and 4.0 cm, and more preferably about 3.0 cm.

The mound 29 on the tungsten layer 24A preferably has a height of between about 2000 and 3000 Angstroms, and preferably has a base width/length/diameter 29A of between about 0.35 and 0.8 μm, which is between about 67 and 100% of the contact opening 21 width.

Figure 6:
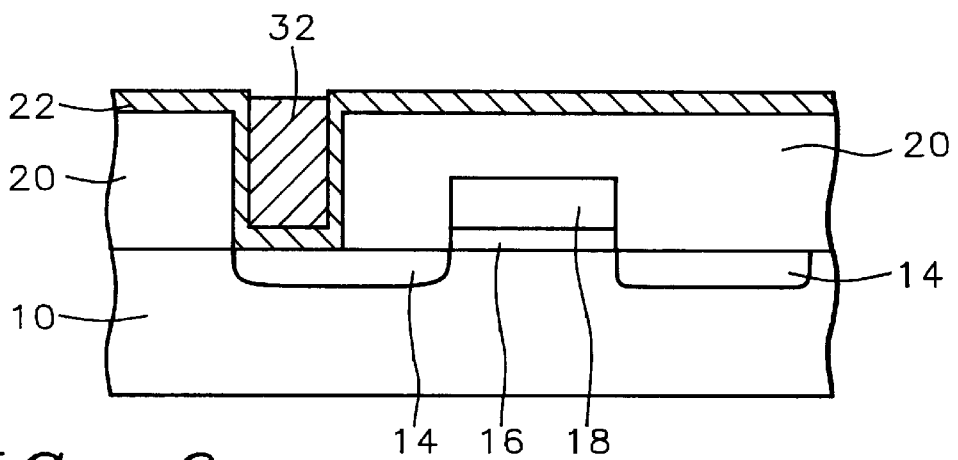

Now referring to FIG. 6, the photoresist block 28 is removed and the tungsten layer 24A is etched again forming a tungsten plug 32 with a planar surface inside the opening. The tungsten layer 24A is preferably etched using a $SF_6/N_2$ plasma at a flow rate of between about 300 and 500 sccm, and more preferably 400 sccm, at a pressure of between about 200 and 400 mTorr, and more preferably 300 mTorr, at a temperature of between about 0 and 80° C., and more preferably 40° C., for a duration determined by endpoint detection, an over etch of between about 35 and 60%, and more preferably 40%, and an electrode spacing of between about 2.0 and 4.0 cm, and more preferably 3.0 cm. Nitrogen gas can be added to the plasma etch at a flow rate of between about 10 and 20 sccm, and more preferably 15 sccm.

An over etch is used to ensure etch back uniformity and to remove excess tungsten layer and tungsten residue. The mound 29 of the present invention eliminates the dimple problem because the over etch etches the mound to a point about level (planar) with the insulating layer surface. Therefore the over etch does not create the dimple problem.

Figure 7:
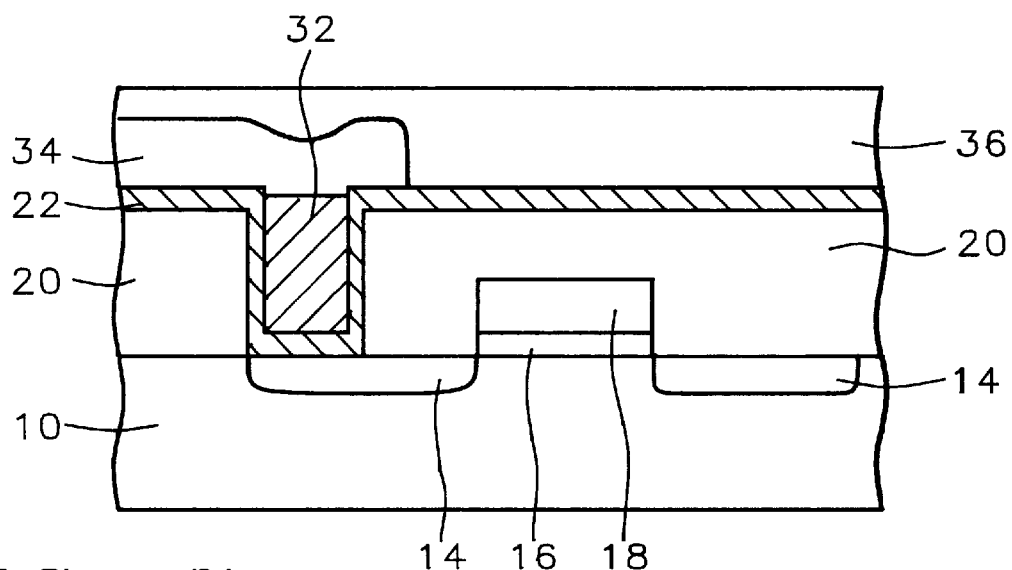

Processing continues as is conventional in the art with metal deposition and patterning. FIG. 7 shows a patterned metal layer 34, such as aluminum and an intermetal dielectric layer 36. Further levels of tungsten plugs and metallization (metallization layers) can be fabricated using the dimple-free tungsten plug process of the present invention to complete fabrication of the integrated circuit.

The process of the invention results in the elimination of dimple problems in the tungsten etching back process. The tungsten etch back process provides better control due to the extended etch back process window. Better metal step coverage can be achieved across the tungsten plug.

While the invention has been particularly shown and described with reference to the preferred embodiments thereof, it will be understood by those skilled in the art that various changes in form, and details may be made without departing from the spirit and scope of the invention.

What is claimed is:

1. A method of forming a dimple free metal plug in the fabrication of semiconductor device structures in and on a semiconductor substrate;

a) depositing an insulating layer overlying said semiconductor device structures;

b) etching an opening through said insulating layer to contact one of said semiconductor device structures, said opening defined by 8000 a first image optical mask;

c) depositing a metal layer over said insulating layer and within said opening; said metal layer is composed of tungsten and is deposited by low pressure chemical vapor deposition (LPCVD) to thickness of between about 5000 and 8000 Angstroms;

d) forming a photoresist block over a portion of said metal layer covering said opening; said photoresist block is formed using a reverse image process using a positive photoresist and a reverse image mask that is a reverse image of said first image optical mask; said photoresist block has a diameter of between about 67 and 100% of the width of said opening;

e) partially isotropically etching back said metal layer using said photoresist block as a mask, using a fluorine containing plasma, forming a mound of said metal layer under said photoresist block over said opening; the partial etch back removes a thickness of said metal layer of between about 2000 and 3000 Angstroms and said mound having a height of between about 2000 and 3000 Angstroms;

f) removing said photoresist block; and g) etching said metal layer forming a metal plug with a planar surface inside said opening.

2. The method of claim 1 wherein said semiconductor device structures include gate electrodes and source/drain regions and wherein said one of said semiconductor device structures contacted is a source/drain region.

3. The method of claim 1 wherein said semiconductor device structure is a metallization layer.

4. The method of claim 1 wherein said photoresist block has a diameter of between about 0.35 and 0.8 μm.

5. The method of claim 1 which further includes forming an adhesion layer over said insulating layer and underlying said metal layer.

6. The method of claim 5 wherein said adhesion layer is composed of a material selected from a group consisting of collimated titanium, titanium, and titanium nitride.

7. A method of metallization in the fabrication of an integrated circuit comprising:

a) providing semiconductor device structures in and on a semiconductor substrate;

b) depositing an insulating layer overlying said semiconductor device structures;

c) forming an opening through said insulating layer to contact one of said source/drain region, said opening formed by a photolithography process using a first image optical mask;

d) depositing a tungsten layer over said insulating layer and within said opening, said tungsten layer having a thickness of between about 5000 and 8000 Angstroms;

e) forming a photoresist block over a portion of said tungsten layer covering said opening, said photoresist block formed by using a reverse image process using a negative photoresist and said first image optical mask used to expose said opening; said first image optical mask is used to expose said negative photoresist to form said photoresist block;

f) partially isotropically etching back a portion of said tungsten layer using a fluorine containing plasma, forming a mound of said tungsten layer under said photoresist block over said opening;

g) removing said photoresist block;

h) etching said tungsten layer forming a tungsten plug with a planar surface inside said opening;

I) depositing a metal layer over said tungsten plug and the top surface of said substrate and patterning said metal layer; and j) depositing a passivation layer overlying said patterned metal layer completing said metallization in said fabrication of said integrated circuit.

8. The method of claim 7 wherein said semiconductor device structures include gate electrodes and source/drain regions and wherein said one of said semiconductor device structures contacted is a source/drain region.

9. The method of claim 7 wherein said semiconductor device structure is a metallization layer.

10. The method of claim 7 wherein said photoresist block has a diameter of between about 0.35 and 0.8 μm.

11. The method of claim 7 wherein said tungsten layer is etched using a $SF_6/N_2$ plasma.

12. The method of claim 7 which further includes forming an adhesion layer over said insulating layer and underlying said tungsten layer.

13. The method of claim 12 wherein said adhesion layer is composed of a material selected from a group consisting of collimated titanium, titanium, and titanium nitride, having a thickness of between about 400 and 1200 Angstroms.

14. A method of metallization in the fabrication of an integrated circuit comprising:

a) providing semiconductor device structures in and on a semiconductor substrate; said semiconductor device structures include gate electrodes and source/drain regions and wherein one of said semiconductor device structures contacted is a source/drain region;

b) depositing an insulating layer overlying said semiconductor device structures;

c) forming an opening through said insulating layer to contact one of said semiconductor device structures, said opening formed by a photolithography process using a first image optical mask;

d) forming an adhesion layer over said insulating layer; said adhesion layer is composed of a material selected from a group consisting of collimated titanium, titanium, and titanium nitride, having a thickness of between about 400 and 1200 Angstroms;

e) depositing a tungsten layer over said adhesion layer and said insulating layer and within said opening, said tungsten layer having a thickness of between about 5000 and 8000 Angstroms;

f) forming a photoresist block over a portion of said tungsten layer covering said opening, said photoresist block formed by using a reverse image process using a negative photoresist and said first image optical mask is used to expose said negative photoresist to form said photoresist block; said photoresist block has a diameter of between about 0.35 and 0.8 μm;

g) partially isotropically etching back a portion of said tungsten layer using a fluorine containing plasma, forming a mound of said tungsten layer under said photoresist block over said opening, said partial etch back removes a thickness of said tungsten layer of between about 2000 and 3000 Angstroms, and said mound having a thickness of between about 2000 and 3000 Angstroms;

h) removing said photoresist block;

i) etching said tungsten layer using a using a $SF_6/N_2$ plasma forming a tungsten plug with a planar surface inside said opening;

j) depositing a metal layer over said tungsten plug and the top surface of said substrate and patterning said metal layer; and k) depositing a passivation layer overlying said patterned metal layer completing said metallization in said fabrication of said integrated circuit.

* * * * *